(12) United States Patent
Souma et al.

(10) Patent No.: US 7,888,958 B2
(45) Date of Patent: Feb. 15, 2011

(54) CURRENT TEST PROBE HAVING A SOLDER GUIDE PORTION, AND RELATED PROBE ASSEMBLY AND PRODUCTION METHOD

(75) Inventors: Akira Souma, Aomori (JP); Yoshikazu Urushiyama, Dresden (DE); Masahisa Tazawa, Aomori (JP); Tomoya Sato, Aomori (JP); Hideki Hirakawa, Aomori (JP); Takayuki Hayashizaki, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 328 days.

(21) Appl. No.: 12/096,168

(22) PCT Filed: Jan. 25, 2006

(86) PCT No.: PCT/JP2006/301601

§ 371 (c)(1),
(2), (4) Date: Jun. 4, 2008

(87) PCT Pub. No.: WO2007/086147

PCT Pub. Date: Aug. 2, 2007

(65) Prior Publication Data

US 2010/0213956 A1     Aug. 26, 2010

(51) Int. Cl.
*G01R 31/00* (2006.01)
(52) U.S. Cl. .............................. 324/755.07; 324/754.03
(58) Field of Classification Search ........................ None
See application file for complete search history.

(56) References Cited

U.S. PATENT DOCUMENTS 5,453,017 A * 9/1995 Belopolsky .................. 439/83

2002/0060580 A1 * 5/2002 Yamabe ....................... 324/754
2002/0061668 A1    5/2002 Fujimura
2002/0146920 A1 * 10/2002 Sugiyama ..................... 439/66

FOREIGN PATENT DOCUMENTS

| JP | 2005-055194 | 3/2002 |
| JP | 2002-158264 | 5/2002 |
| JP | 2002-164104 | 6/2002 |
| JP | 2002-283049 | 10/2002 |

OTHER PUBLICATIONS

Pat. Abstract of JP (2002-164104), Jun. 7, 2002, Ando Electric Co. Ltd.
Pat. Abstract of JP (2002-283049), Oct. 2, 2002, Ando Electric Co. Ltd.
Pat. Abstract of JP (2002-158264), May 31, 2002, Ando Electric Co. Ltd.
Pat. Abstract of JP (2005-055194), Mar. 3, 2002, Japan Electronic Materials Corp.

* cited by examiner

*Primary Examiner*—Minh N Tang
(74) *Attorney, Agent, or Firm*—Ingrassia Fisher & Lorenz, P.C.

(57) ABSTRACT

A probe for current test is provided. The probe includes a probe body having a plate-like connection portion whose end face becomes a connection face to a probe board, a solder layer formed on at least one side face of said connection portion, and a guide portion formed on the connection portion. The guide portion penetrates the connection portion in its thickness direction from the one side face with the solder layer formed to the other side face. When the solder layer is melted, the guide portion guides a portion of the melted solder to the other side face.

13 Claims, 10 Drawing Sheets

CURRENT TEST PROBE HAVING A SOLDER GUIDE PORTION, AND RELATED PROBE ASSEMBLY AND PRODUCTION METHOD

TECHNICAL FIELD

The present invention relates to a probe, a probe assembly suitable for a current test of semiconductor devices such as semiconductor integrated circuits and a method for producing them.

BACKGROUND

Semiconductor devices such as multiple semiconductor integrated circuits formed on each chip region of a semiconductor wafer undergo a current test to determine whether or not each of them is produced according to its specification. In this type of current test is used a probe assembly generally called probe card. When the plural probes (contacts) provided on a probe board of this probe assembly are pressed against their corresponding electrodes of a device under test, the device under test is connected to a tester through the probe assembly.

In this probe assembly, the probe is connected to each attaching land portion provided at a wiring circuit of the probe board.

In a conventional production of a probe assembly, lead-free cream solder containing multiple solder balls having a particle diameter of, e.g., 15-25 µm are generally used to adhere each probe to each corresponding attaching land portion of the probe board. The cream solder is supplied to connecting end portions of the probes by spraying. The probes to which the cream solder adhered are held at a predetermined attitude such that their connecting end faces abut the land portion of a probe board. In this held state, a laser beam is applied to the connecting end portion of the probe, melting the solder by its thermal energy, and solidification of the melted solder makes each probe fixed on the corresponding land portion.

Figure 4:
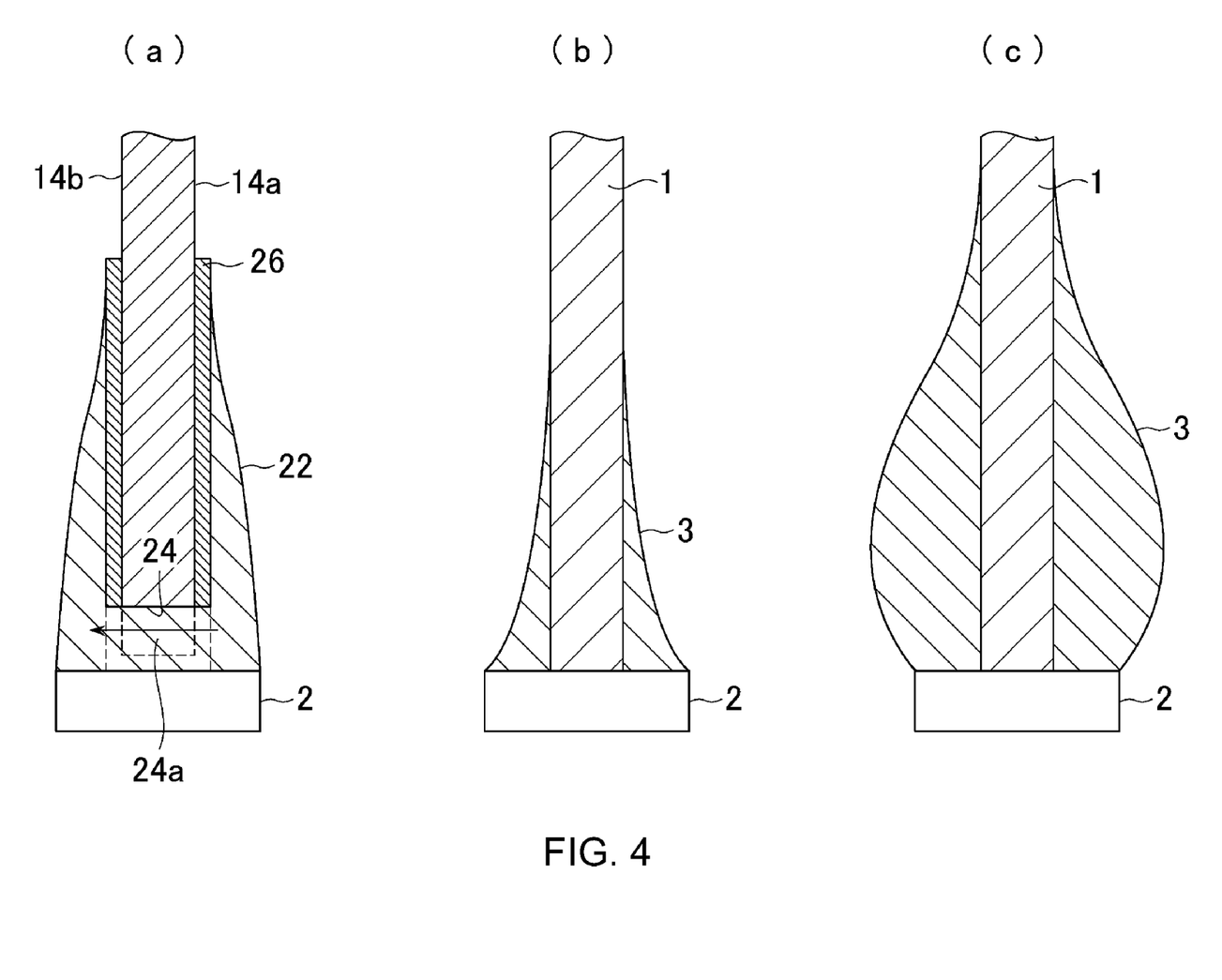

It is, however, very difficult to apply a proper amount of cream solder to the connecting end portion of each probe by spraying. As shown in FIG. 4(b), if the amount of the solder 3 is short in combining the probe 1 and the wiring land portion 2, connection strength becomes too low to obtain a desired connection strength. On the other hand, as shown in FIG. 4(c), excessive solder 3 sticking out largely from the wiring land portion 2 causes a short-circuit between the adjacent probes, and the excessive solder scattering around causes a contamination problem to probe handling instruments. Thus, the supply of the excessive solder brings about various inconveniences.

It is, therefore, proposed to plate the connection end face of the probe with tin as the solder, and to fix the probe on the probe board by a metal compound formed by melting together with a gilded layer formed on a contact mounting face of the probe board (see Patent Document 1).

According to this, since the solder is supplied beforehand to the connecting end face of each probe as tinned layer of the probe, the solder is not supplied excessively between the probe and the probe board. This can dissolve the problem of excessive supply of the solder.

However, since the tin to be formed on the probe connecting end face is formed by plating, the thickness of the layer is under severe restrictions. Furthermore, since the area of the connecting end face is small, the connecting end face cannot be enlarged without large-sizing the probe. Therefore, since it is not possible, by the technique described in the Patent Document 1, to hold a proper amount of solder enough to pass around behind both its side portions of the end face of the probe connection portion, an amount of solder sufficient to obtain a desired connecting strength cannot be supplied to the connection portion of the probe between the probe and the probe board.

Patent Document: Japanese Patent Appln. Public Disclosure No. 2005-55194

DISCLOSURE OF THE INVENTION

Problem to be Solved

It is, therefore, an object of the present invention to enable to supply the solder to the connecting end portions in just proportion, thereby obtaining a sufficient connection strength without short-circuiting.

Means to Solve Problem

The probe for current test according to the present invention is characterized to comprise: a probe body which has a plate-like connection portion whose end face constitutes a connection face to a probe board; a solder layer formed on at least one side face of the connection portion; and a guide portion which is formed at the connection portion and penetrates from the one side face with the solder layer formed to the other side face in its plate thickness direction and which, when the solder layer is melted, can guide a portion of the melted solder layer to the other side face.

In the probe according to the present invention, the solder is preformed at least on one side face of the connection portion in a layer state. The connection portion being plate-like, the side face thereof with the solder layer formed has a sufficiently larger area than its end face. Since the solder layer is formed on the side face of the connection portion availing of this side face which has the large area, the present invention enables to reserve beforehand a just amount of solder in the probe body.

Effect pf the Invention

Also, since an adequate amount of solder can be supplied, it does not happen that an excess portion scatters around as heretofore, and it is possible to save the scattered excess portion which would have been discarded heretofore. It is also possible to prevent such environmental pollution as before caused by scattering the excess solder, which dispenses with a particular washing process of machines or instruments to handle the probes and simplifies a production process.

Further, a portion of the solder melted, for example, by heating can be surely passed around behind the other side face of the probe body through the guide portion. Thus, since the amounts of the melted solder can be approximately uniform by the melted solder flow through the guide portion on both sides of the connection portion, a proper amount of solder can be supplied to the probe connection portion so as to make the amounts of solder approximately uniform on both its sides without causing excess or shortage in supply of the solder. As a result, solder contamination of a probe handling device and probe short circuit due to excessive supply can be prevented, and strength poverty due to shortage in solder can be surely prevented. Also, if the area of the solder layer is selected properly, substantially uniform and proper fillets can be formed on both side faces of the connection portion of the probe body by hardening of the melted solder.

A solder layer can be provided on each side face of the connection portion of the probe body. In such a case, the thickness of the solder layer or its area can be reduced substantially to half as much as when a solder layer is provided on one side face. For equalization of the solder, it is desirable to provide the solder layers on both side faces of the connection portion. For simplification of the production process of the probes, however, it is desirable to provide the solder layer on one side face of the probe body.

The solder layer can be formed by a conductive adhesive layer made of a meltable metal material such as simple tin or a tin alloy containing any one or more of gold, silver, cupper and bismuth.

Also, for the solder layer can be used a plated layer formed by a plating method, for example, by electroforming. Since the thickness of the plating layer can be accurately controlled, the amount of solder to be supplied can be more accurately controlled by forming the solder layer from a plating layer. Thus, since this plating layer can prevent more surely the solder from sticking out, it is particularly effective for the probes arranged at narrow pitches.

The guide portion can be formed by a concave groove opening in the end face of the connection portion.

Also, the concave groove can be formed on the end face by a sinuous curved surface continuous in an extending direction that is orthogonal to the thickness direction of the connection portion.

The probe body can be made of nickel, its alloy or phosphor bronze. In such a case, adhesion of the solder to the probe body can be enhanced by disposing a gold plating layer between the one side face of the probe body and the solder layer.

A probe assembly can be made, using the probe for current test according to the present invention. This probe assembly is characterized by comprising a probe board having a wiring path with a plurality of attachment land portions formed and a plurality of probes to be adhered to the land portions of the probe board, each probe having a probe body including a plate-like connection portion whose end face is disposed opposite to the land portion; a solder layer formed on at least one side face of the connection portion; and a guide portion which is formed in the connection portion, penetrating the connection portion from the one side face with the solder layer formed to the other side face in the thickness direction of the connection portion, and which is capable of guiding a portion of the solder, when melted, toward the other side face, and characterized in that the end face of the connection portion is adhered to the corresponding land portion after the melted adhesive layer solidifies.

The production method of the current test probes according to the present invention is characterized by including: a step for forming by photolithography a probe body having a plate-like connection portion and a guide portion provided on the end face of the connection portion, the guide portion penetrating the connection portion in its thickness direction from one side face thereof to the other side face; and a step for forming a solder layer capable of melting at least on the one side face of the connection portion of the probe body and having the guiding portion guide a portion thereof to the other side, when melted.

According to the production method of the probe in the present invention, the probe body can be formed by using photolithography, so that the guide portion can be formed simultaneously with the formation of the probe body and that the probe can be produced efficiently.

The production method according to the present invention can be applied to the production of the probe assembly for current test. According to this method, the probe assembly of the present invention can be efficiently produced by irradiating the end portion with a laser for melting the solder layer, making the end face of the connection portion of the probe body of the probe abut the land portion.

Also, as in the case of the connection portion of the probe, it is possible to preform the solder layer on the land portion, thereby obtaining more sure coupling of the probe and the land portion.

According to the present invention, as described above, the solder is placed beforehand in a layer state at least on one side face of the connection portion, thereby enabling to reserve beforehand an adequate amount of solder on the probe body, and besides, a portion of the melted solder can be passed around surely behind the other side face of the probe body through the guide portion, so that, without causing excess or shortage in supplying the solder, an adequate amount of solder can be supplied approximately uniform on both sides of the connection portion of the probe.

BRIEF DESCRIPTION OF THE DRAWINGS

FIG. 4 shows an example of comparison between the present invention and a conventional example, in which FIG. 4(a) is a vertical section of the connection portion of the probe according to the present invention after being connected to the wiring portion; Figs. (b) and (c) are vertical sections similar to FIG. 4(a) showing the connection portion of the conventional example with excess or shortage of solder.

FIG. 5 is a view similar to FIG. 2, in which FIGS. 5(a) and (b) respectively show other examples of the present invention.

BEST MODE TO CARRY OUT THE INVENTION

Figure 1:
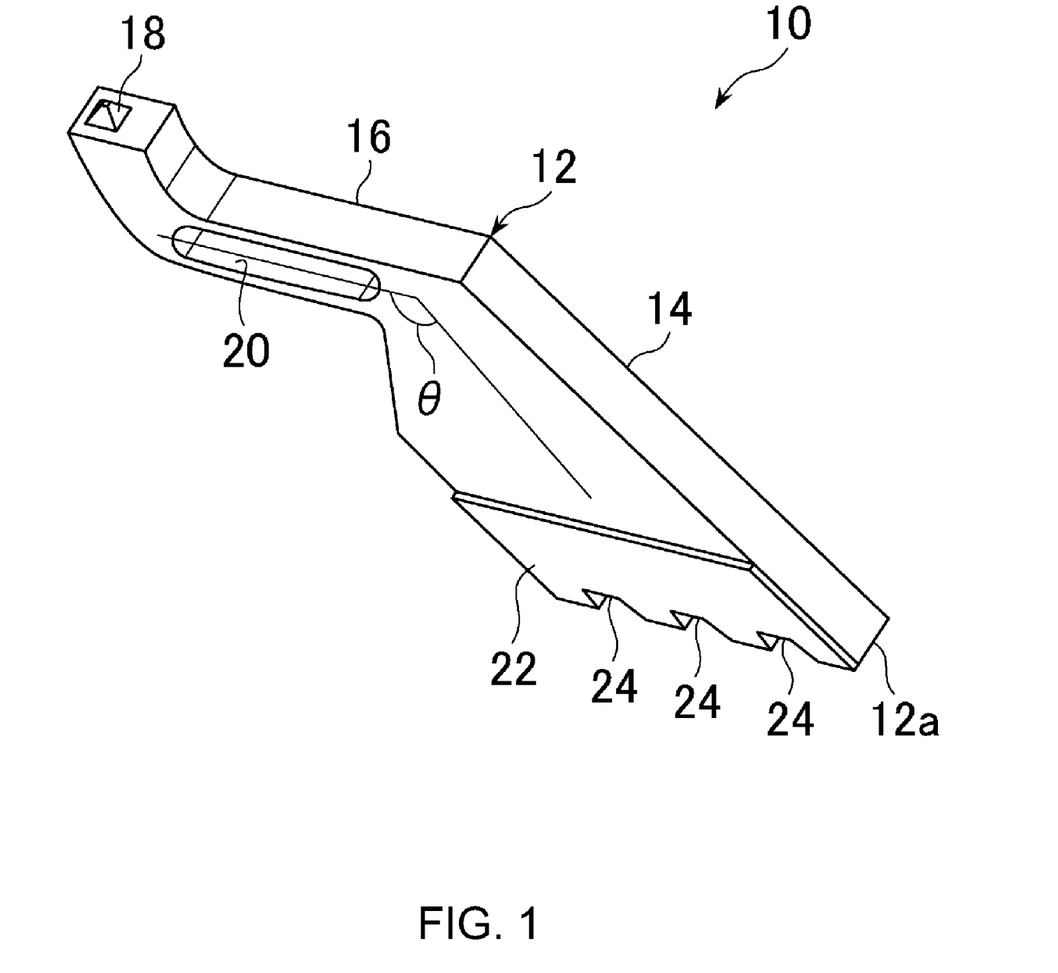
FIG. 1 is a perspective view of the probe according to the present invention.

The probe 10 according to the present invention is, as shown in FIG. 1, provided with a generally plate-like probe body 12. The probe body 12 has: a flat rectangular end face 12a which is used as a connection face to a wiring path described later; a plate-like connection portion 14 rising angularly from the end face; and an arm portion 16 extending at an obtuse angle θ in a direction approximately parallel to the longitudinal direction of the end face 12a from the front end of the connection portion 14 on a plane including the connection plane to a wiring path to be described later. The front end portion of the arm portion 16 rises in a direction to be away from the end face 12a of the connection portion 14, and a tip 18 is formed at the front end face.

The probe body 12 except the tip 18 is made of a highly tough metal material such as, for example, nickel, its alloy or phosphor bronze. In the illustration, in order to enhance the flexibility of the arm portion 16, a long hole 20 penetrating in the thickness direction of the arm and extending along the longitudinal direction of the arm portion 16 is formed.

The tip 18 can be made of the same metal material as that of the probe body 12 integrally therewith. From the viewpoint of raising durability, however, the pyramidal tip 18, as shown in the illustration, is preferably made of a hard metal material such as cobalt, rhodium or their alloys and embedded in the front end portion of the arm portion 16.

For coupling the probe body 12 with the wiring path, a plating layer 22 made of solder is formed in the neighboring portion of the end face 12a of the connection portion 14, and a concave groove 24 opening in the end face is formed on the end face 12a. A part of the connection portion 14 including the solder plating layer 22 and the concave groove 24 of the probe 10 is schematically shown in an enlarged state in FIGS. 2 and 3.

Each concave groove 24 is formed across the end face 12a in its width direction, penetrating from one side face 14a of the connection portion 14 to the other side face 14b. In the illustration, three concave grooves 24 each having a flat bottom face are formed at intervals in the longitudinal direction of the end face 12a.

Figure 2:
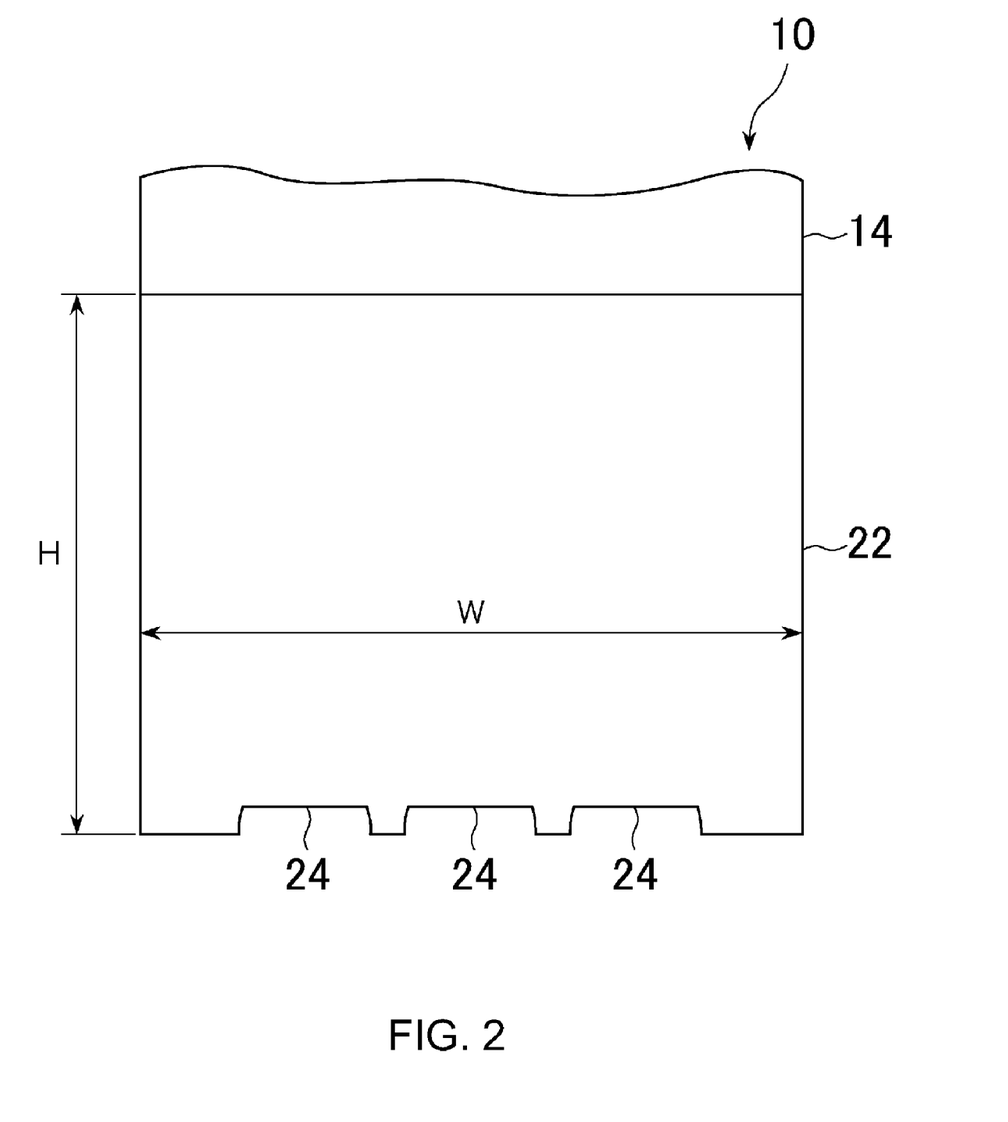
FIG. 2 is a partly enlarged plan view schematically showing the connection portion of the probe shown in FIG. 1
Figure 3:
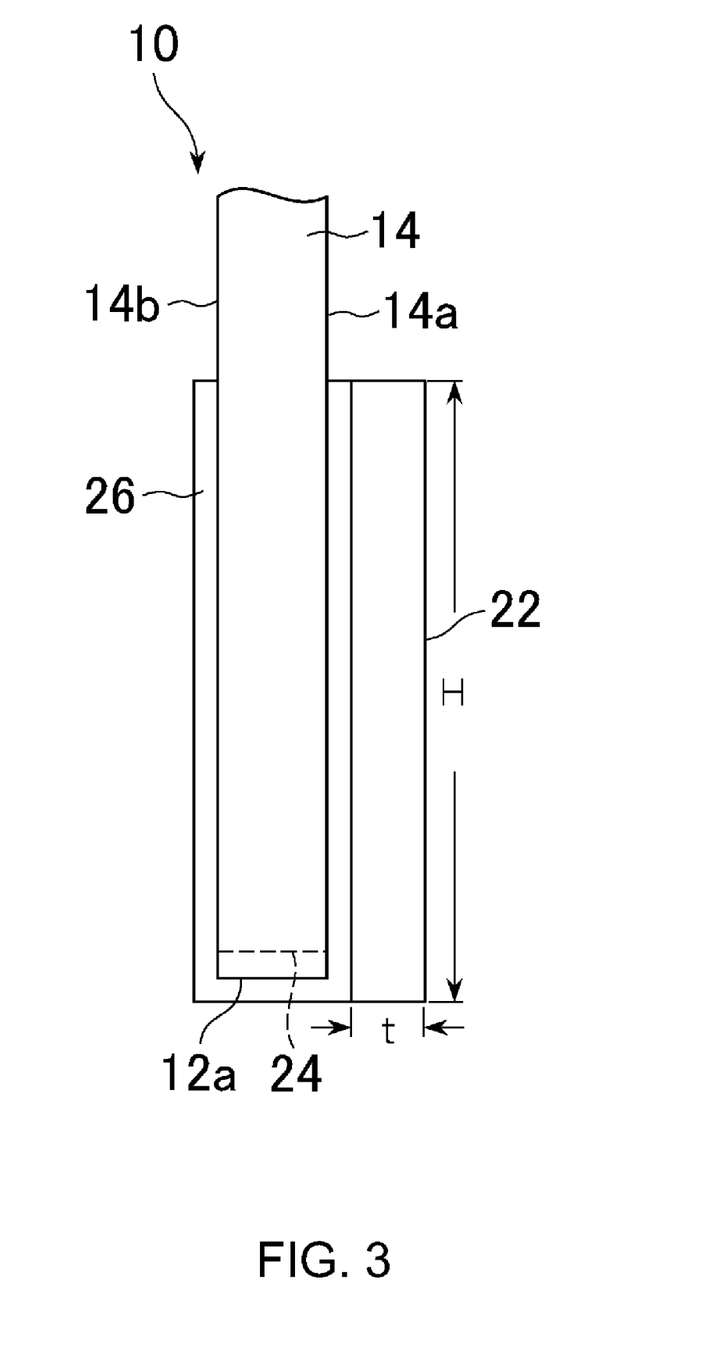
FIG. 3 is a partly enlarged side view schematically showing the connection portion of the probe shown in FIG. 1.

In the examples shown in FIGS. 2 and 3, the solder plating layer 22 is formed on one side face 14a of the connection portion 14 through the gold plating layer 26. The gold plating layer 26 is formed, as clearly shown in FIG. 3, covering the end face 12a of the probe 10, and the neighboring portion of the end face 12a in both side faces 14a and 14b of the connection portion 14, and the solder plating layer 22 is formed, overlapping a portion covering one side face 14a of the gold plating layer 26.

The width dimension W of the solder plating layer 22 is approximately 600 µm, and the height dimension H thereof is approximately 250 µm. Thus, the area S of the solder plating layer 22 is approximately 600×250 µm². Also, the thickness dimension t of the solder plating layer 22 is 30 µm±2 µm. In this case, the amount of solder held at the connection portion 14 of each probe 10 by the solder plating layer 22 is within a weight range of 30 to 35 mg.

The solder plating layer 22 can be formed by a conductive adhesive layer made of a metal material, such as a tin alloy containing one or more of a simple substance of tin or gold, silver, copper and bismuth, capable of melting by heating.

To combine the probe 10 with a wiring land portion 2 similar to the conventional one, as shown in FIG. 4(a), when the plating layer 22 formed on one side face 14a of the connection portion 14, as shown in FIG. 3, with the end face 12 mounted on the wiring land portion 2 is heated and melted, a portion of the liquid solder 22 is guided to the other side face 14b, as shown in FIG. 4(a), through a path 24a formed by a space of the concave groove 24 and is spread over the gold plating layer 26.

The liquid solder 22 on the gold plating layer 26 is affected by gravity to cause a downward hanging and, as the temperature falls, is solidified into fillets as shown in FIG. 4(a). Since the liquid solder 22 is fixed on the connection portion 14 and the wiring land portion 2 due to its solidification, the probe 10 is fixedly coupled with the wiring land portion 2 through the solder.

As explained above along FIGS. 4(b) and (c) concerning the conventional art, if excess or shortage in solder 3 occurs, a strong connection cannot be surely obtained, but it is possible to surely obtain a strong coupling of the probe 10 and the wiring land portion 2 by realizing the fillets without excess or shortage as shown in FIG. 4(a).

Such ideal fillets uniform on both side faces 14a and 14b of the connection portion 14 without excess and shortage can be achieved by holding a proper amount of solder as the plating layer 22 of the connection portion 14 and properly selecting the size of the guiding portion which is formed by the concave groove 24.

To achieve ideal fillets, it is possible to preform a solder layer like the solder plating layer 22 on the wiring land portion 2 in case the amount of solder may be short by the solder plating layer 22.

It is also possible to form the solder plating layer 22 on the gold plating layer 26 on both side faces 14a, 14b of the connection portion 14.

It is possible to dispense with the gold plating layer 26 and form the solder plating layer 22 directly on the probe body 12. It is desirable, however, to use the gold plating layer 26 in order to obtain a strong coupling between the solder 22 and the probe body 12 without using flux.

Figure 5:
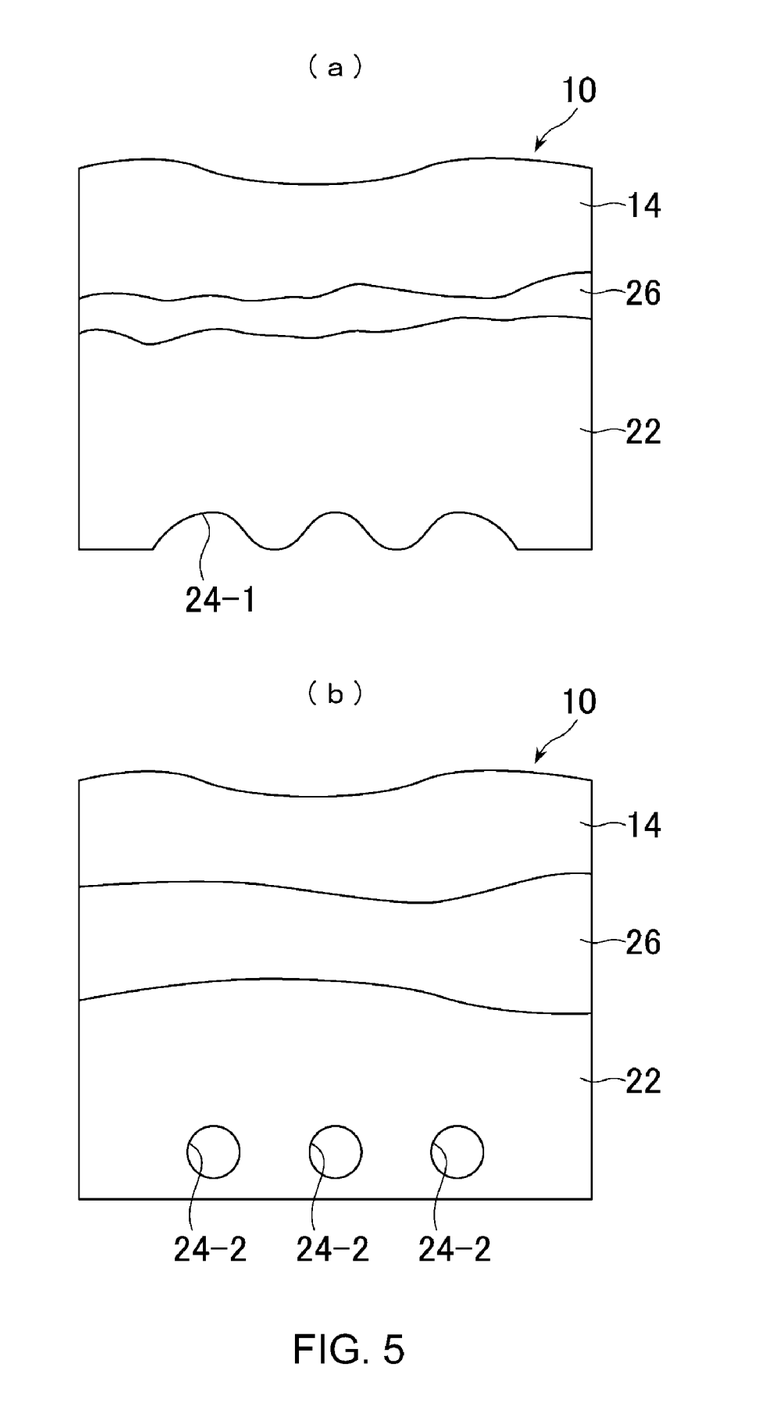

In place of the concave groove 24 formed on the end face 12a of the probe 10, it is possible, as shown in FIG. 5(a), to make a part of the end face 12a a sinuous curved surface 24-1. Each of the bottom parts of the sinuous curved surface 24-1, when formed continuously in the longitudinal direction, that is, the extending direction, of the end face 12a in a region excluding both ends thereof, can serve as a guide portion of the liquid solder 22 like the concave groove 24.

The guide portion of the liquid solder 22 is not necessarily provided on the end face 12a. For instance, as shown in FIG. 5(b), it is possible to form a guide portion as mentioned above by a plurality of through holes 24-2 opening in both side faces 14a, 14b, each penetrating the connection portion 14 in its thickness direction. The respective through holes 24-2 are arranged at a distance from the end face in the neighborhood of the end face 12a of the connection portion 14 so as to be provided at a height position to enable to guide the melted liquid solder 22 to both side faces 14a, 14b.

Figure 6:
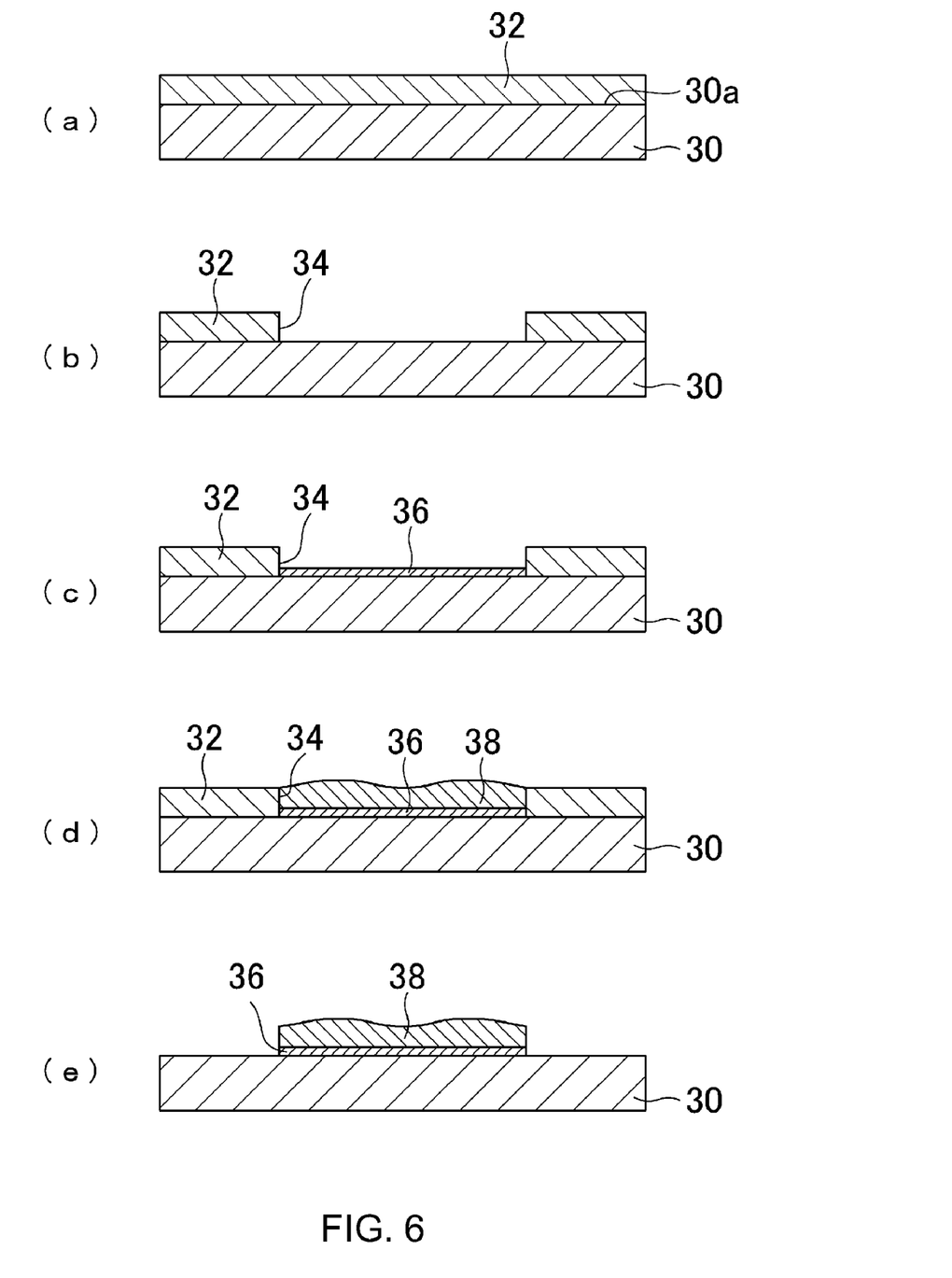
FIG. 6 is an explanatory view showing a step (1) of the production method of the probe of the present invention.
Figure 7:
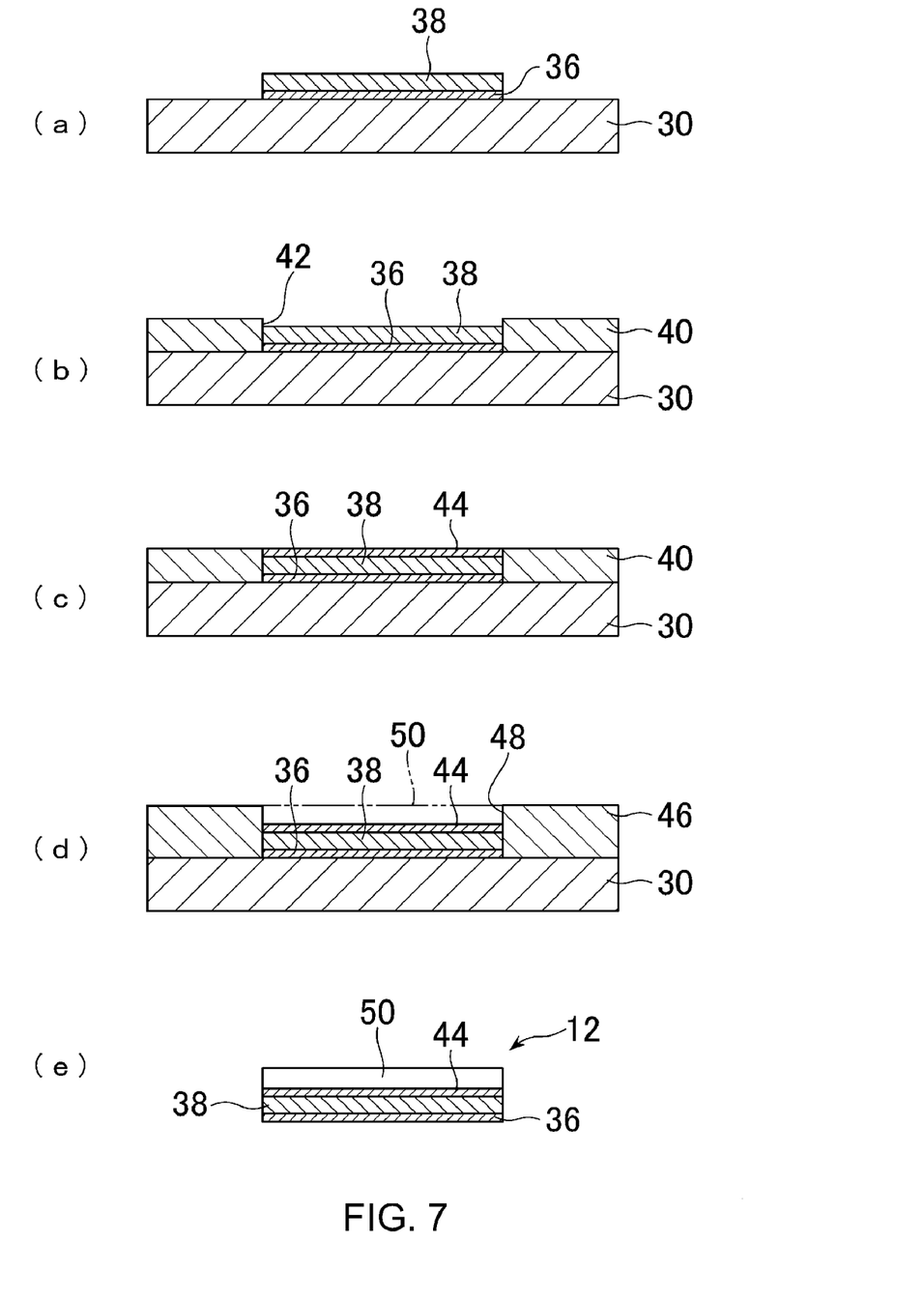
FIG. 7 is an explanatory view showing a step (2) of the production method of the probe of the present invention.

The production method of the probe 10 according to the present invention is explained in the following with reference to FIGS. 6 and 7.

As shown in FIG. 6(a), when a liquid sensitive material is applied to a working plate 30 made of, for example, a stainless plate member having a flat surface 30a and a photoresist film 32 is formed, an exposure mask (not shown) shaped to correspond to a planar pattern of the probe 10 is used on the photoresist film 32, and the photoresist film 32 undergoes selective exposure. After this selective exposure, the photoresist film 32 undergoes film processing.

By this film processing, a recess 34 to expose the flat surface 30a of the working plate 30 is formed on the photoresist film 32, as shown in FIG. 6(b). This recess 34 corresponds to the planar configuration of the probe 10 including the arm portion 16 and also includes parts having a configuration corresponding to the concave groove 24.

As shown in FIG. 6(c), when a gold plating layer 36 which has a thickness leaving the recess 34 is formed in a desired region of the recess 34 according to need, a layer 38 made of a conductive metal material such as the above-mentioned nickel, its alloy or phosphor bronze, is deposited in the recess 34 by use of heretofore well-known electroforming technique, as shown in FIG. 6(d). In case the gold plating layer 36 is formed under the conductive metal material layer 38, the conductive metal material layer 38 is integrally formed with the underlying gold plating layer 36.

After the deposition of the conductive metal material layer 38, as shown in FIG. 6(e), the photoresist film 32 is removed, and then, as shown in FIG. 7(a), the conductive metal material layer 38 undergoes surface grinding so as to have a predetermined thickness.

After the surface grinding of the conductive metal material layer 38, a sensitive material such as mentioned above is applied again to the working plate 30 and the conductive meal material layer 38, and then, the sensitive material is subjected to the selective exposure and film processing using the same exposure mask as the one mentioned above. Thus, as shown in FIG. 7(b), a photoresist film 40 to fringe the conductive metal material layer 38 is formed so as to expose the conductive metal material layer 38. This photoresist film 40 forms a recess 42 which exposes the conductive metal material layer 38. The depth of the recess up to the surface of the conductive metal material layer is shallow. The recess 42 has a planar shape corresponding to that of the probe 10.

By using the recess 42 of the photoresist film 40, as shown in FIG. 7(c), a gold plating layer 44 similar to the gold plating layer 36 is formed in a desired region. This gold plating layer 44 continues to the aforementioned gold plating layer 36 integrally therewith at a portion covering the end face 12a of the probe body 12 not shown in FIG. 7(c).

After the formation of the gold plating layer 44, the photoresist film 40 is removed and the sensitive material is applied to cover the gold plating layer 44, and subsequently, by using an exposure mask corresponding to the planar shape of the solder plating layer 22, the sensitive material is selectively exposed. By the film processing after the sensitive exposure, as shown in FIG. 7(d), the depth of the recess 48 formed by this photoresist film 46, that is, the depth up to the surface of the gold plating layer 44 is approximately equal to the desired thickness dimension t of the solder plating layer 22.

Within the recess 48, a conductive adhesive layer 50 made of a metal material which can melt by heating such as a tin alloy containing either one or more of the foregoing single tin substance or gold, silver, copper and bismuth is deposited by using the same electroforming is deposited on so as to be integral with the conductive adhesive layer 44 by using an electroforming technique similar to one mentioned above. Thereafter, the surface of the conductive adhesive layer 50 undergoes surface grinding according to need, the photoresist film 46 is removed from the working plate 30, and the laminated body (36, 38, 44 and 50) is removed from the working plate 30. Thus, the probe body 12 is formed as shown in FIG. 7(e), and the tip 18 is attached to the body to complete the probe 10.

By a photolithography technique using the photoresist films 32, 40 and 46, the concave groove 24 or the sinuous curved surface 24-1 is formed on the end face 12a during the formation process of the probe body 12, or a through hole 24-2 can be formed in the connection portion 14 of the probe body 12, so that the probe 12 can be made efficiently.

Also, since the deposit area S and the deposit thickness 5 of the conductive adhesive layer 50, that is, the plating layer 22 can be controlled at high accuracy by use of the photolithography, an adequate and accurate amount of solder without excess or shortage can be kept in the connection portion 14.

Figure 8:
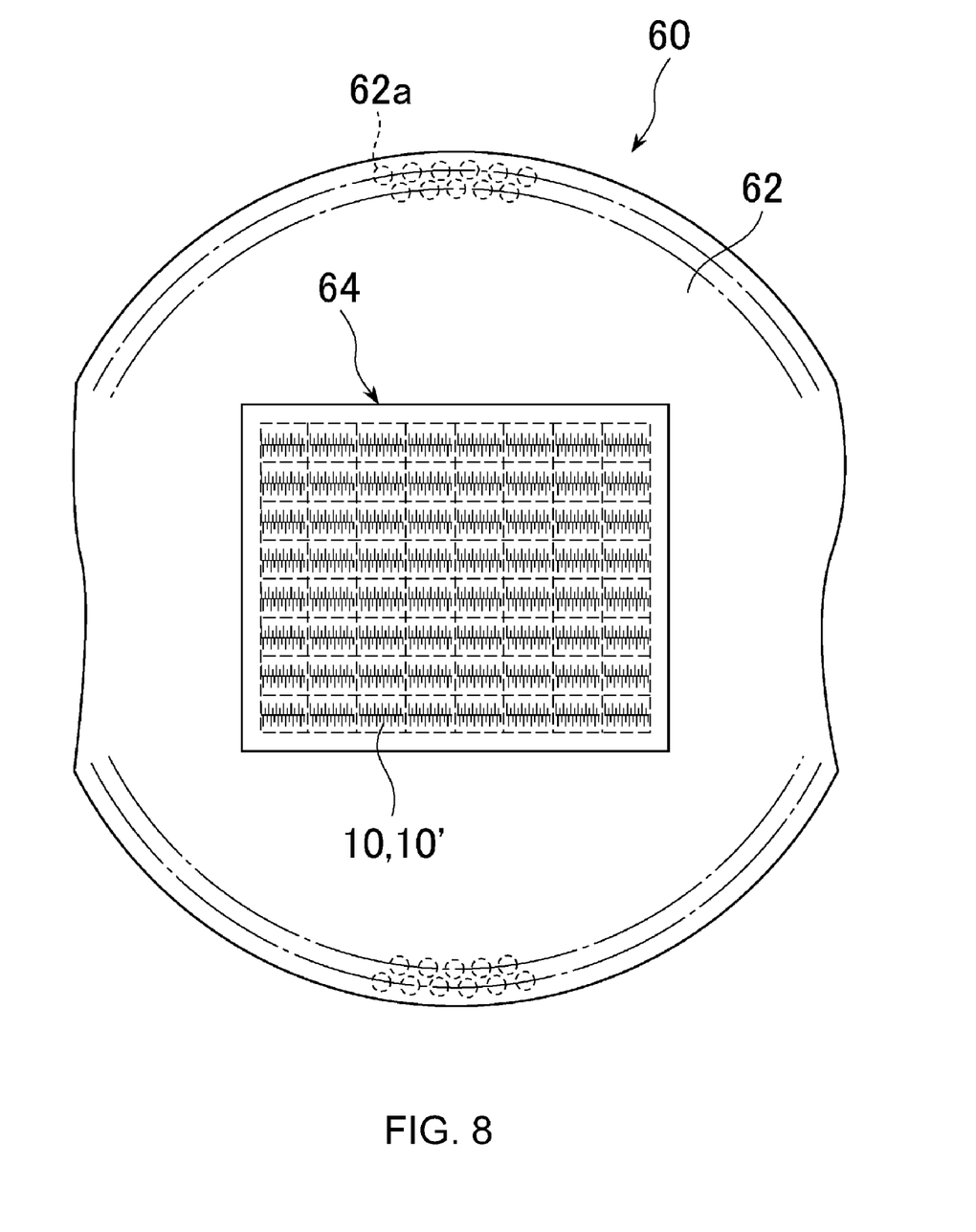
FIG. 8 is a bottom view showing the probe assembly according to the present invention.
Figure 9:
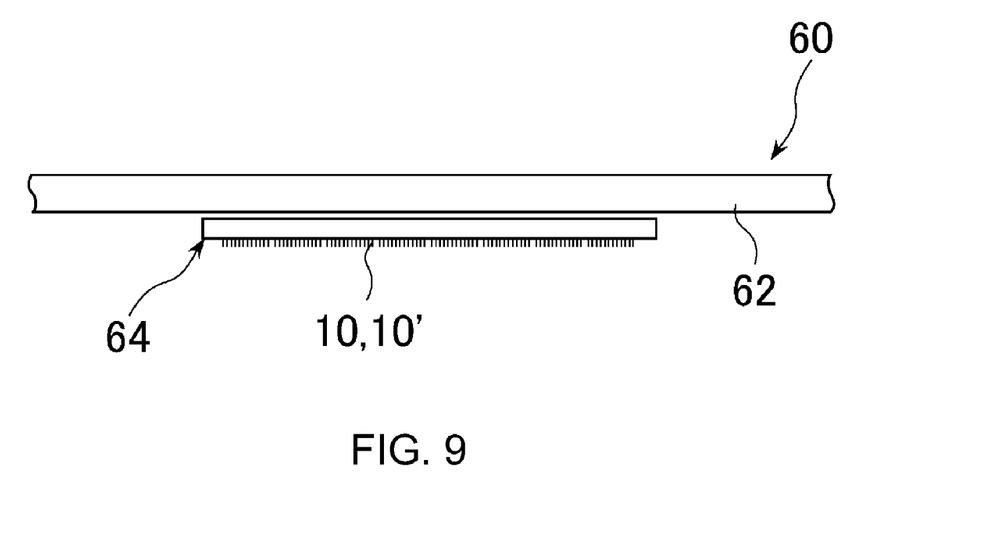
FIG. 9 is a side view showing the probe assembly according to the present invention.
Figure 10:
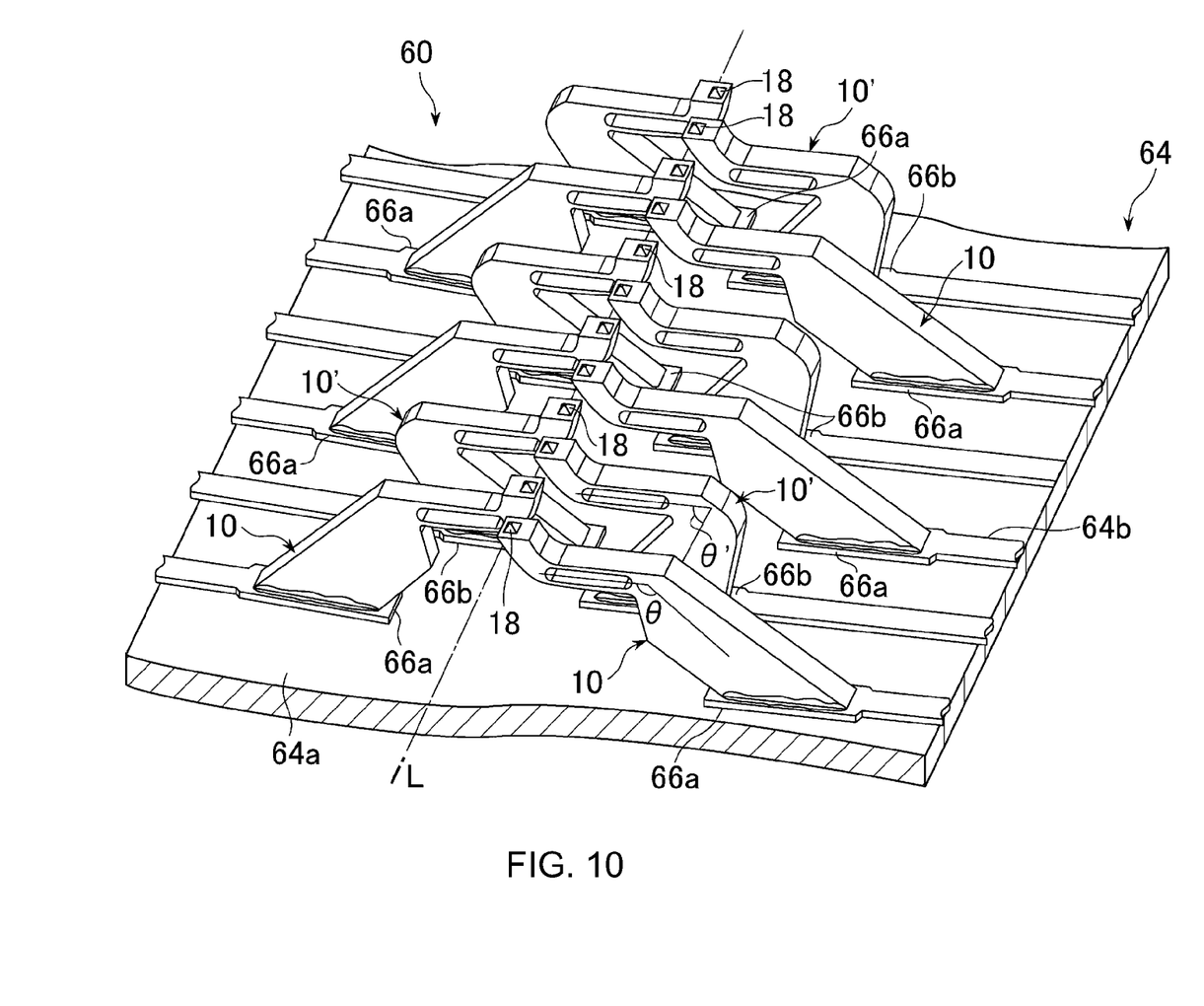
FIG. 10 is a partly enlarged perspective view showing the probe assembly shown in FIG. 8.

The above-mentioned probe 10 can be used in a probe assembly 60 shown in FIGS. 8-10.

This probe assembly 60 is applicable to a current test of semiconductor integrated circuits such as plural semiconductor chips arranged in a matrix state on a semiconductor wafer not shown. The probe assembly 60 comprises, as shown in FIGS. 8 and 9, a circular wiring board 62 and a rectangular probe board 64 disposed on the underside of the wiring board. As shown in FIG. 8, a plurality of tester lands 62a to be connected to a tester (not shown) for current test are formed on the upside of the wiring board 62.

The probe board 64 is provided with, as shown in FIG. 10, an electrical insulating plate 64a such as ceramic, for example, and a plurality of wiring paths 64b are formed on the underside of the insulating plate. Each wiring path 64b reaches the upside of the electrical insulating plate 64a which is not shown but well known heretofore, and the probe board 64 is secured to the wiring board so that each wiring path 64b is connected electrically to the corresponding tester land 62a, such that the upside of the probe board 64, that is, the electrical insulating plate 64a opposes to the underside of the wiring board 62.

In the example shown in FIG. 10, the probe 10 and a probe 10' similar to the probe is used. A difference between the probe 10 and the probe 10' is that an angle θ between the connection portion 14 of the probe 10 and the arm portion 16 is an obtuse angle, while in the probe 10', the angle between the connection portion 14 and the arm portion 56 is an acute angle θ'. Otherwise, other constitutions are the same as those of the probe 10.

Each wiring path 64b is formed on both sides of a perpendicular plane which includes an imaginary straight line L and orthogonal to the electrical insulating plate 64a. Each wiring path 64b extends towards the perpendicular plate with the extending direction of the imaginary line L as a width direction. Also, the wiring paths 64b are arranged such that those whose distal end positions are near the imaginary line L and those whose distal ends are far therefrom become alternate. Further, there is a gap between the arrangements of the wiring paths 64b on both sides of the imaginary line L so that the extension line of each wiring path 64b on one side of the imaginary line L may extend between those on the other side.

At each distal end position the land portion 66 (66a, 66b) is formed, and on each side of the imaginary line L, the probe 10' is disposed on the attachment land portion 66a provided at a relatively remote position from the imaginary line. Also, the probe 10' is disposed on the attachment land portion 66b which is provided nearer the imaginary line L than the attachment land portion 66a is.

The respective probes 10 and 10' are alternately aligned along the imaginary straight line L with their tips 18 aligning on the imaginary straight line L. With each end faces 12a mounted on the corresponding attachment land portion 66 (66a, 66b), the solder plating layer 22 of each probe 10, 10' is scanned by a laser beam to heat and melt the solder plating layer 22 efficiently, and by the solidification due to the lowering of temperature, thereby securing each probe 10, 10' firmly to the corresponding land portion 66 without excess or shortage of solder.

Also, adopting such an arrangement form of the respective probes 10, 10' and wiring paths 64b as shown in FIG. 10 surely prevents adjoining probes 10, 10' from being damaged and enables to arrange the tips 18 of the plural probes 10, 10' closely.

INDUSTRIAL APPLICABILITY

The present invention is not limited to the above embodiments but can be variously modified without departing from its purport.

The invention claimed is:
1. A probe for current test comprising:
a probe body having a plate-like connection portion whose end face serves as a connection face to a probe board, the connection portion having a first side face, a second side face, and a thickness between the first side face and the second side face;
a solder layer preformed on at least said first side face of said connection portion; and
a guide portion formed in the connection portion, penetrating said connection portion in its thickness direction from said first side face to said second side face, and when said solder layer is melted for guiding melted solder toward and onto the second side face such that solidified solder adheres to both the first side face and the second side face.

2. The probe claimed in claim 1, wherein said preformed solder layer is a meltable conductive adhesive layer made of a tin alloy containing any one or more of single tin substance, gold, silver, copper and bismuth.

3. The probe claimed in claim 1, wherein said solder layer is a plating layer.

4. The probe claimed in claim 1, wherein said guide portion is formed by a concave groove on the end face opening in said end face of said connection portion.

5. The probe claimed in claim 4, wherein said concave groove is formed by a sinuous curved surface continuing in an extending direction orthogonal to the thickness direction of said connection portion on said end face.

6. The probe claimed in claim 1, wherein said probe body is made of nickel, its alloy or phosphor bronze and wherein a gold plating layer is disposed between the one side face of said probe body and said solder layer.

7. A method of producing a probe for current test, comprising steps of:
    forming a probe body having a plate-like connection portion and a guiding portion on an end face of said connection portion, the guiding portion penetrating said connection portion from a first side face to a second side face of said connection portion, wherein forming the probe body involves photolithography; and
    forming a meltable solder layer on at least the first side face of said connection portion of said probe body, wherein, when the meltable solder layer is melted, some melted solder is guided onto said second side face by said guiding portion.

8. The method of production claimed in claim 7, wherein the step of forming said meltable solder layer on the first side face of said connection portion of said probe body uses the photolithography of said step for forming said probe body.

9. A probe assembly for current test comprising:
    a probe board having a plurality of wiring paths with a plurality of land portions formed; and
    a plurality of probes secured to the land portions, wherein each probe of the plurality of probes comprises:
        a probe body having a plate-like connection portion whose end face is disposed opposite to its corresponding land portion, said connection portion having a first side face and a second side face;
        a preformed solder layer on said first side face of said connection portion; and
        a guide portion formed in said connection portion, said guide portion penetrating said connection portion in its thickness direction from said first side face to said second side face, wherein, when said preformed solder layer is melted, said guide portion guides melted solder toward and onto the second side face, and wherein the end face of said connection portion is secured to the corresponding land portion due to solidification of said melted solder on both the first side face and the second side face.

10. The probe assembly claimed in claim 9, wherein said preformed solder layer is a meltable conductive adhesive layer which is made of a tin alloy containing any one or more of simple tin substance, gold, silver, copper and bismuth.

11. The probe assembly claimed in claim 9, wherein said preformed solder layer is a plating layer.

12. The probe assembly claimed in claim 9, wherein said guide portion is formed by a concave groove on said end face opening in said end face of said connection portion.

13. The probe assembly claimed in claim 12, wherein said concave groove is formed by a sinuous curved surface continuing in an extending direction orthogonal to the thickness direction of said connection portion on said end face.

* * * * *